(12) United States Patent
Kim

(10) Patent No.: US 9,941,863 B2
(45) Date of Patent: Apr. 10, 2018

(54) POWER GATING CONTROL CIRCUIT FOR STABLY CONTROLLING DATA RESTORING

(71) Applicant: Samsung Electronics Co., Ltd., Suwon-si, Gyeonggi-do (KR)

(72) Inventor: Sangwoo Kim, Suwon-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 0 days.

(21) Appl. No.: 15/090,896

(22) Filed: Apr. 5, 2016

(65) Prior Publication Data

US 2016/0359472 A1 Dec. 8, 2016

(30) Foreign Application Priority Data

Jun. 4, 2015 (KR) .................... 10-2015-0079366

(51) Int. Cl.
*H03K 3/012* (2006.01)
*H03K 3/037* (2006.01)

(52) U.S. Cl.
CPC ........... *H03K 3/012* (2013.01); *H03K 3/0375* (2013.01)

(58) Field of Classification Search
CPC .............................. H03K 3/0375; H03K 3/012
See application file for complete search history.

(56) References Cited

U.S. PATENT DOCUMENTS

| | | | |
|---|---|---|---|
| 7,138,842 B2 * | 11/2006 | Padhye ................ | H03K 3/0375 327/203 |
| 7,365,596 B2 * | 4/2008 | Padhye ............... | G06F 13/4072 327/200 |
| 7,394,687 B2 * | 7/2008 | Bertin .................... | B82Y 10/00 365/151 |
| 7,583,121 B2 * | 9/2009 | Berzins ............ | H03K 3/356008 327/202 |
| 7,626,434 B2 * | 12/2009 | Aksamit .............. | H03K 3/0375 327/202 |
| 7,639,056 B2 * | 12/2009 | Gururajarao ..... | H03K 3/356008 327/202 |
| 7,652,513 B2 * | 1/2010 | Rao ........................ | H03K 3/012 327/203 |
| 7,710,177 B2 * | 5/2010 | Hoover .................. | H03K 3/012 327/199 |
| 7,948,263 B2 * | 5/2011 | Kim ................... | H03K 19/0013 326/112 |
| 8,188,782 B1 | 5/2012 | Lai et al. | |

(Continued)

FOREIGN PATENT DOCUMENTS

JP 2013135312 A 7/2013

*Primary Examiner* — Thomas J Hiltunen

(74) *Attorney, Agent, or Firm* — Harness, Dickey & Pierce, P.L.C.

(57) ABSTRACT

Provided is a power gating control circuit for stably controlling data restoring. The power gating control circuit includes a retention circuit and a non-retention circuit. The retention circuit includes a first flip-flop, which stores or restores data of the first flip-flop in a power gating mode. The non-retention circuit includes a second flip-flop and a third flip-flop. The power gating control circuit performs initialization of data of the second flip-flop and the third flip-flop in the power gating mode, and an initialization operation of the non-retention circuit is controlled to be performed before data of the retention circuit is restored.

20 Claims, 8 Drawing Sheets

(56) References Cited

U.S. PATENT DOCUMENTS

| | | | |
|---|---|---|---|
| 8,421,513 B2* | 4/2013 | Pal | H03K 3/012 |
| | | | 327/199 |
| 8,456,214 B2 | 6/2013 | Frederick, Jr. | |
| 8,705,267 B2* | 4/2014 | Endo | H03K 3/356008 |
| | | | 365/149 |
| 2004/0051574 A1* | 3/2004 | Ko | H03K 3/356008 |
| | | | 327/218 |
| 2010/0174956 A1* | 7/2010 | Kawasaki | G01R 31/31855 |
| | | | 714/726 |
| 2014/0361820 A1 | 12/2014 | Lundberg | |
| 2016/0301396 A1* | 10/2016 | Jayapal | H03K 3/356008 |

\* cited by examiner

POWER GATING CONTROL CIRCUIT FOR STABLY CONTROLLING DATA RESTORING

CROSS-REFERENCE TO RELATED APPLICATION

This application claims priority under 35 U.S.C. § 119 to Korean Patent Application No. 10-2015-0079366 filed on Jun. 4, 2015, in the Korean Intellectual Property Office, the disclosure of which is hereby incorporated by reference in its entirety.

BACKGROUND

Field

At least some example embodiments of inventive concepts relate to a power gating control circuit such as a power gating control circuit for stably controlling data restoring.

Description of Related Art

While image resolution has increased, data traffic between a mobile application processor and a display driver integrated circuit (IC) has rapidly increased. Accordingly, power consumed by the mobile application processor and/or the display driver IC also has gradually increased.

In general, while multimedia data traffic increases and the number of function blocks to which a power source is supplied increases, the mobile application processor consumes more power.

SUMMARY

At least some example embodiments of inventive concepts provide a power gating control circuit for stably controlling data restoring and a method of controlling the same.

The technical objectives of inventive concepts are not limited to the above disclosure. Other objectives may become apparent to those of ordinary skill in the art based on the following descriptions.

At least one example embodiment of inventive concepts discloses a power gating control circuit includes a retention circuit including a first flip-flop and which stores or restores data of the first flip-flop in a power gating mode and a non-retention circuit including a second flip-flop and a third flip-flop. The power gating control circuit performs initialization of data of the second and third flip-flops in the power gating mode, and an initialization operation of the non-retention circuit is controlled to be performed before data of the retention circuit is restored.

In at least one example embodiment of inventive concepts, in response to an output clock and a retention signal, the first flip-flop of the retention circuit may perform storing of the data before entering the power gating mode, perform restoring of the data after entering the power gating mode, and may be connected to the second flip-flop so as to receive an output of the second flip-flop.

In at least one example embodiment of inventive concepts, an initialization operation of the second flip-flop of the non-retention circuit may include a synchronous flip-flop synchronized with an output clock, and an initialization operation of the third flip-flop of the non-retention circuit may include an asynchronous flip-flop unrelated to the output clock.

In at least one example embodiment of inventive concepts, in response to the output clock and a reset signal, the second flip-flop may perform the initialization of the data therein after the power gating mode is released. The initialization operation of the second flip-flop of the non-retention circuit may include a synchronous flip-flop synchronized with an output clock.

In some example embodiments, after the power gating mode is released, the third flip-flop is unrelated to the output clock and may perform the initialization operation in response to a reset signal. The initialization operation of the third flip-flop of the non-retention circuit may include an asynchronous flip-flop unrelated to the output clock.

In some example embodiments, during a restoring operation of the data of the first flip-flop, the output clock may be paused.

In accordance with some example embodiments of inventive concepts, a power gating control circuit includes a power management circuit (PMC) that controls supplying of power to a plurality of circuits, a clock management circuit (CMC) controlled by the PMC, and that provides an output clock and is able to operate in a retention mode. The PMC may also include a retention circuit, which receives the output clock and is able to operate in the retention mode; and a non-retention circuit, which receives the output clock and performs an initialization of data. The PMC controls to independently perform entering the CMC and the retention circuit into the retention mode.

In some example embodiments, the PMC may control a release operation of the retention mode of the retention circuit to be independently performed from an initialization operation of the non-retention circuit.

In some example embodiments, the CMC may temporarily suspend the output clock in response to when the retention mode of the retention circuit is released.

In some example embodiments, the PMC may provide a clock stop request signal to the CMC such that the output clock of the CMC is temporarily suspended.

In some example embodiments, the PMC may provide each of separate signals for entering the retention mode to the CMC and the retention circuit.

In some example embodiments, releasing of the CMC from the retention mode may be controlled to be performed before releasing of the retention circuit from the retention mode.

In some example embodiments, the retention circuit may include a first flip-flop, which performs storing or restoring of data in response to a retention signal and the output clock.

In some example embodiments, the non-retention circuit may respond to a reset signal and the output clock, the non-retention circuit includes a second flip-flop synchronized with the output clock, and that performs an initialization operation. The non-retention circuit may also include a third flip-flop, which performs an initialization operation regardless of the output clock, and may be connected to the first flip-flop such that an output of the second flip-flop is provided to the first flip-flop.

In some example embodiments, the second flip-flop, which is a synchronous flip-flop, may not include a reset terminal; and the third flip-flop, which is an asynchronous flip-flop, may include the reset terminal.

In some example embodiments, before data of the retention circuit is restored, an initialization operation of the non-retention circuit may be performed.

In accordance with some example embodiments of inventive concepts, a mobile device includes a memory device, an application processor, which controls data processing and operation of the memory device; and a display device, which displays data processed by the application processor. The application processor may include a retention circuit, which includes a first flip-flop and that stores or restores data of the first flip-flop in a power gating mode. The application processor may also include a non-retention circuit, which includes a second flip-flop and a third flip-flop. The power gating control circuit performs initialization of data of the second flip-flop and the third flip-flop in the power gating mode. The data of the retention circuit may be controlled to be restored after the non-retention circuit is initialized.

In some example embodiments of inventive concepts, in response to an output clock and a retention signal, the first flip-flop of the retention circuit may perform storing of the data before entering the power gating mode; perform restoring of the data after entering the power gating mode; and may be connected to the second flip-flop so as to receive an output of the second flip-flop.

In some example embodiments of inventive concepts, an initialization operation of the second flip-flop of the non-retention circuit may include a synchronous flip-flop synchronized with an output clock, and an initialization operation of the third flip-flop of the non-retention circuit may include an asynchronous flip-flop unrelated to the output clock.

In some example embodiments of inventive concepts, a data restoring operation of the first flip-flop may be controlled to be performed after the data of the second flip-flop is initialized.

In at least some example embodiments of inventive concepts, the power gating control circuit comprises a clock management circuit and a retention circuit. The clock management circuit is configured to, generate an output clock signal based on a clock signal, receive a clock stop request signal from a power management circuit (PMC), suspend the output clock based on the receiving of the clock stop request signal, and forward a clock stop acknowledgment signal to the PMC based on the clock stop request signal. Whereas, the retention circuit is configured to perform one of storing and restoring of data in the retention circuit based on a retention signal and the output clock, the restoring of the data being based on the suspending of the output clock.

The power gating circuit of example embodiments also comprises a non-retention circuit that is configured to initialize the data in the non-retention circuit before the retention circuit restores the data of the retention circuit. The retention circuit includes a first and the non-retention circuit includes a second and third flip-flop. The second flip-flop, which includes a synchronous flip-flop, is configured to forward output values to the first flip-flop in the retention circuit. The third flip-flop, which includes an asynchronous flip-flop, is configured to operate independently of the output clock.

BRIEF DESCRIPTION OF THE DRAWINGS

The foregoing and other features and advantages of inventive concepts will be apparent from the more particular description of non-limiting example embodiments of inventive concepts, as illustrated in the accompanying drawings in which like reference characters refer to the like parts throughout the different views. The drawings are not necessarily to scale, emphasis instead being placed upon illustrating the principles of inventive concepts. In the drawings.

DETAILED DESCRIPTION OF EXAMPLE EMBODIMENTS

Figure 1:
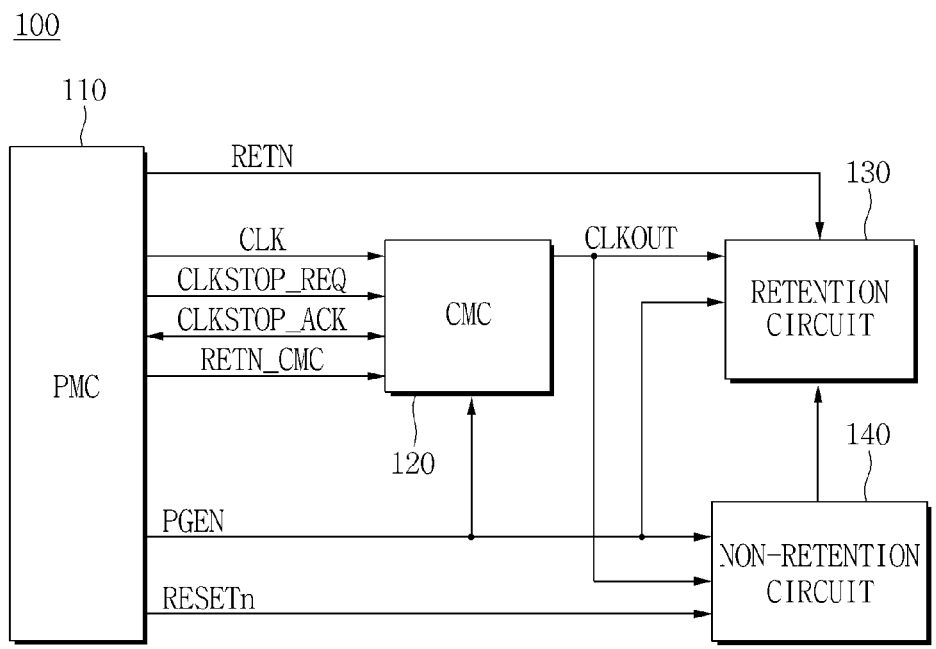
FIG. 1 is a block diagram of a power gating control circuit in accordance with an example embodiment of inventive concepts.

Hereinafter, non-limiting example embodiments of inventive concepts that are easily performed by those skilled in the art will be described in detail with reference to the accompanying drawings. In detailed descriptions of the non-limiting example embodiments of inventive concepts, detailed descriptions of well-known configurations unrelated to the gist of inventive concepts will be omitted. In this specification, when reference numerals are assigned to components of each drawing, it should be noted that, although the same components are illustrated in different drawings, the same numerals are assigned as much as possible.

Particular structural or functional descriptions for non-limiting example embodiments disclosed in this specification are only for the purpose of description of the embodiments of inventive concepts. Non-limiting example embodiments of inventive concepts may be variously modified in form and are not limited to the exemplary embodiments in this specification.

While inventive concepts are susceptible to various modifications and alternative forms, specific non-limiting example embodiments thereof are shown by way of example in the drawings and will herein be described in detail. It should be understood, however, that there is no intent to limit inventive concepts to the particular forms disclosed, but on the contrary, inventive concepts are to cover all modifications, equivalents, and alternatives falling within the spirit and scope of inventive concepts.

It will be understood that, although the terms "first," "second," etc. may be used herein to describe various elements, these elements should not be limited by these terms. These terms are only used to distinguish one element from another. For example, a first element could be termed a second element, and similarly, a second element could be termed a first element, without departing from the scope of inventive concepts.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion, that is, "between" versus "directly between," adjacent" versus "directly adjacent," etc.

The terminology used herein is for the purpose of describing particular embodiments only and is not intended to be limiting of inventive concepts. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein are to be interpreted as is customary in the art to which these inventive concepts belong. It will be further understood that terms in common usage should also be interpreted as is customary in the relevant art and not in an idealized or overly formal sense unless expressly so defined herein.

Meanwhile, when an example embodiment can be implemented differently, functions or operations described in a particular block may occur in a different way from a flow described in the flowchart. For example, two consecutive blocks may be performed simultaneously, or the blocks may be performed in reverse according to related functions or operations.

Hereinafter, example embodiments of inventive concepts will be described with reference to the accompanying drawings.

FIG. 1 is a block diagram of a power gating control circuit in accordance with an example embodiment of inventive concepts.

First, a power gating control technique reduces leakage current by blocking a primary power source supplied to a logical block in a low power mode or a sleep mode in a system-on-chip (SOC). Hereby, standby power may be reduced and battery performance may be improved.

Referring to FIG. 1, a power gating control circuit 100 may include a power management circuit (PMC) 110, a clock management circuit (CMC) 120, a retention circuit 130, and a non-retention circuit 140.

The PMC 110 may provide or receive power gating control-related signals, such as, including but not limited to, a retention signal (RETN), a clock signal (CLK), a clock stop request signal (CLKSTOP_REQ), a clock stop acknowledge signal (CLKSTOP_ACK), CMC retention signal (RETN_CMC), a power gating enable signal (PGEN), and a reset signal (RESETn).

The PMC 110 may adaptively control a power mode and a retention mode of the CMC 120, the retention circuit 130, and the non-retention circuit 140. For example, the PMC 110 generates separate signals, for example, the CMC retention signal RETN_CMC and the retention signal RETN, such that a process in which each of the retention circuit 130 and the CMC 120 enters the retention mode is performed separately.

Further, the PMC 110 may control reset-related timing such that a reset operation of the non-retention circuit 140 is performed before the retention mode of the retention circuit 130 is deactivated (exit or released). In this way, data loss after data restoring of the retention circuit 130, may be prevented due to uninitialized data of the non-retention circuit 140. This will be further described in detail below.

Continuously, the PMC 110 may provide the clock CLK to the CMC 120. Further, the PMC 110 may provide the clock stop request signal CLKSTOP_REQ to the CMC 120 and may receive the clock stop acknowledge signal CLKSTOP_ACK from the CMC 120. The PMC 110 may provide the CMC retention signal RETN_CMC, which controls the retention mode of the CMC 120 to the CMC 120.

The CMC 120 may supply an output clock CLKOUT. A frequency of the output clock CLKOUT is adjusted to be suitable for an internal operation in response to the clock CLK of the PMC 110. Further, the CMC 120 may suspend the output clock CLKOUT for a predetermined and/or selected (or desired) time in response to the clock stop request signal CLKSTOP_REQ, and the clock stop acknowledge signal CLKSTOP_ACK.

The retention circuit 130, which is a circuit that operates in a retention mode, may store or restore an internal status of the retention circuit and some of the register values in response to the retention signal RETN, the output clock CLKOUT, and the power gating enable signal PGEN.

The retention mode refers to storing and restoring values of the retention circuit, which requires storing of the internal status of the power gating control circuit or the register values that have been maintained before entering a power gating mode.

In some non-limiting example embodiments of inventive concepts, the retention circuit 130 may be applied to circuits related to system control. When setting values related to the system control are initialized before or after the power gating mode, the setting values may not be appropriate for overall operations of a system, or an operation of an operating system. Therefore, the setting values related to the system control may be maintained or restored using a circuit that performs the retention mode, such as the retention circuit 130.

For similar reasons, the retention mode may also be applied to the CMC 120, which is the circuit related to the system control. In some example embodiments of inventive concepts, a separate CMC retention signal RETN_CMC for the CMC 120 may be used.

The non-retention circuit 140 may perform an initialization operation on the internal status of the power gating retention circuit and the register values in response to the reset signal RESETn, the output clock CLKOUT, and the power gating enable signal PGEN.

Meanwhile, some of output values of the non-retention circuit 140 may be provided as inputs to the retention circuit 130.

The power gating control circuit 100 in accordance with at least some example embodiment of inventive concepts may stably support the data restoring of the retention circuit 130 as well as efficiently increase a circuit area, and efficiently manage power for the power gating control circuit 100 in which the retention circuit 130 and the non-retention circuit 140 are configured in a hybrid type.

Figure 2:
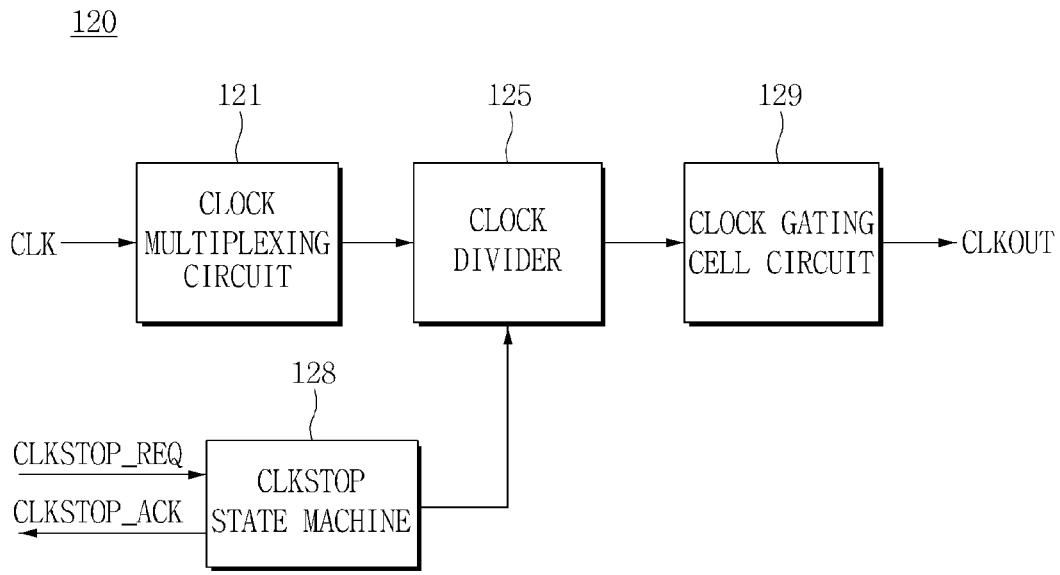
FIG. 2 is a block diagram of a clock management circuit (CMC) illustrated in FIG. 1 according to an example embodiment.

FIG. 2 is a block diagram of the CMC 120 illustrated in FIG. 1 according to an example embodiment.

The CMC 120 may include at least a clock multiplexing circuit 121, a clock divider 125, a CLKSTOP state machine 128, and a clock gating cell circuit 129.

The clock multiplexing circuit 12 may receive a clock CLK, and generate a high-frequency clock.

The clock multiplexing circuit 121 may include a phase locked loop (PLL) circuit according to the intention of the designer. Furthermore, the clock multiplexing block 121 may further include a state machine for controlling the PLL circuit, and may also set a pre-scaler value, a division ratio, a post-scaler value, or the like for the PLL circuit. A flip-flop having the above-described pre-scaler value, the division ratio, the post-scaler value, or the like may also be used.

The clock divider 125 may reduce a frequency of the clock received from the clock multiplexing circuit 121 according to the division ratio. The clock divider 125 may generate divided clocks using rising and falling edges of the clock. A clock selected from various divided clocks may be provided to the clock gating cell circuit 129. The clock divider 125 may use a multiplexing circuit MUX.

The clock divider 125 may be configured as a state machine itself so as to control the division ratio of the clock and toggle timing of the clock according to the intent of the designer. Example embodiments do not exclude that a configuration and operation implementation of the clock divider 125 may be changed by those skilled in the art without limitation.

The clock gating cell circuit 129 may control toggling of the clock when the clock is suspended or started. That is, the clock gating cell circuit 129 may provide or not provide an output clock CLKOUT generated from the clock divider 125 at a predetermined and/or selected (desired) time.

The clock gating cell circuit 129 may provide the output clock CLKOUT received from the clock divider 125 to the retention circuit 130 (see FIG. 1) and the non-retention circuit 140 (see FIG. 1). For example, the clock gating cell circuit 129 may include at least a combination gate, a latch, or the like, such that a glitch does not occur at an edge of the output clock CLKOUT.

The CLKSTOP state machine 128 may provide a clock stop request signal CLKSTOP_REQ to the clock divider 125. When the clock divider 125 responds to the clock stop request signal CLKSTOP_REQ, the CLKSTOP state machine 128 provides a clock stop acknowledge signal CLKSTOP_ACK to the PMC 110 (see FIG. 1). The CLKSTOP state machine 128 may include at least activation timing of the dock stop request signal CLKSTOP_REQ, and a flip-flop that stores an activation maintenance time.

In at least some example embodiments, although the clock multiplexing block 121, the clock divider 125, and the clock gating cell circuit 129 are described as an example embodiment of a scheme that receive the clock CLK, and generate and provide a frequency suitable for an internal circuit, it is not limited thereto.

The output clock CLKOUT may be provided through the clock gating cell circuit 129 directly without passing through the clock divider 125. Alternatively, in at least some example embodiments of inventive concepts the output clock CLKOUT may also be provided by including a circuit having a clock gating function inside the clock divider 125.

The scheme, which may receive the clock CLK and generate the output clock CLKOUT, may be changed without limitation and variously transformed.

A configuration or method of the circuit which generates the output clock CLKOUT does not limit the scope of example embodiments of inventive concepts.

Figure 3:
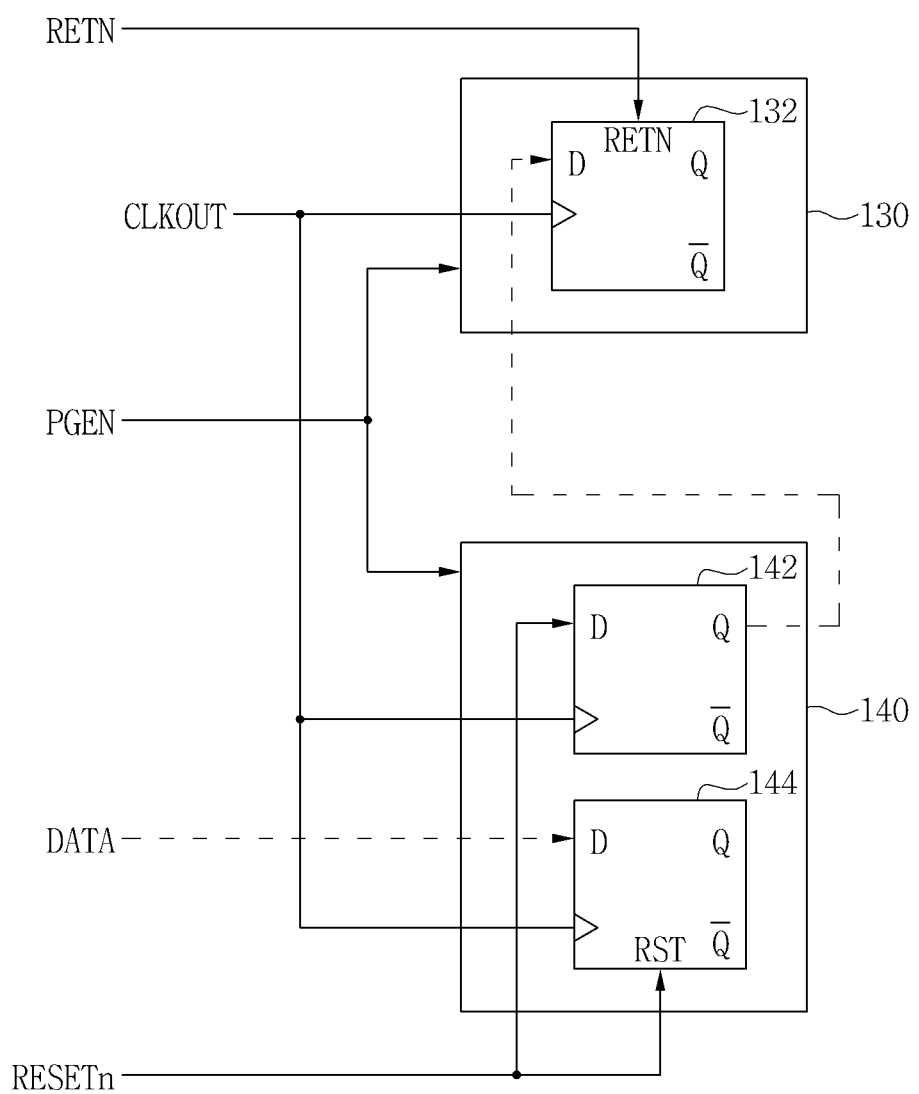
FIG. 3 is a block diagram of a retention circuit and a non-retention circuit illustrated in FIG. 1 according to an example embodiment.

FIG. 3 is a block diagram of the retention circuit 130 and the non-retention circuit 140 shown in FIG. 1 according to an example embodiment.

Referring to FIG. 3, the retention circuit 130 may include a first flip-flop 132 as a retention flip-flop.

The first flip-flop 132 may enter a retention mode and may store or restore previous data in response to an output clock CLKOUT and a retention signal RETN.

Although the non-limiting example embodiment of the first flip-flop 132 is described as one flip-flop for convenience of description, the first flip-flop 132 may include a plurality of flip-flops. That is, the retention circuit 130 includes all registers (the plurality of flip-flops), which requires retention in one function block.

In at least some example embodiments, the retention circuit 130 may store data in a separate storage area when the retention signal RETN is activated. The retention circuit 130 may load the data stored in the storage area to restore as the previous data of the circuit when the retention signal RETN is deactivated. Therefore, before entering a power gating mode (i.e., when a power gating enable signal PGEN is activated), the retention mode is activated, and data such as registers inside the circuit is stably stored.

In at least some example embodiments, when the power gating mode is released (i.e., when the power gating enable signal PGEN is deactivated), the retention mode should be released. In at least one example embodiment of inventive concepts, the output clock CLKOUT is suspended while the retention circuit 130 is restored.

In at least some example embodiments the non-retention circuit 140 may include a second flip-flop 142 and a third flip-flop 144.

When the power gating mode is activated, an internal status of the circuit has 'an unknown value,' and the circuit should be reset using an initialization operation. In the initialization operation, there is a circuit that requires only the reset signal and a circuit that requires a clock with the reset signal.

In at least some example embodiments, the non-retention circuit 140 may include both a flip-flop type using an asynchronous reset flip-flop, and a flip-flop type using a synchronous reset flip-flop. In an example embodiment, the flip-flop using the asynchronous reset flip-flop may be initialized regardless of toggle of the clock, and the flip-flop using the synchronous reset flip-flop requires the clock for initialization.

In at least some example embodiments, the second flip-flop 142, which is the synchronous reset flip-flop synchronized with the output clock CLKOUT and initialized, need not have a separate reset terminal. A data terminal of the second flip-flop 142 may receive a reset signal RESETn, and the second flip-flop 142 is controlled by the output clock CLKOUT. In this way, when the reset signal RESETn is activated and the output clock CLKOUT is received, the second flip-flop 142 may be synchronized with the output dock CLKOUT, that is, data of the second flip-flop 142 is initialized. The data of the second flip-flop 142 may be 'an unknown value' while the data of the second flip-flop 142 is initialized. Some of output values of the second flip-flop 142 may be provided as data of the first flip-flop 132.

In at least some example embodiments, all the output values of the second flip-flop 142 are not provided as the data of the first flip-flop 132, which means that all the output values of the second flip-flop 142 are provided as the data of the first flip-flop 132 in some cases.

Therefore, since there is some of the first flip-flops 132, which receive the output values of the second flip-flop 142, the first flip-flop 132 should not be affected by 'the unknown value' of the second flip-flop 142 that is not initialized.

As it will be described hereinafter, in convention, the CMC 120 was integrated and controlled in one retention circuit because the clocks generated therefrom may require the retention mode. However, in at least some example embodiments of inventive concepts, the CMC 120 and the retention circuit 130 are separated and controlled as respective circuits. In this way, it may be controlled that the initialization of the second flip-flop 142 is firstly performed, and then the retention mode of the first flip-flop 132 is released.

The third flip-flop 144 may include a separate reset terminal RST, which receives the reset signal RESETn. In this way, the third flip-flop 144 may be controlled and initialized by the reset signal RESETn regardless of the output clock CLKOUT. The third flip-flop 144 is illustrated as an asynchronous reset flip-flop, which is not synchronized with the output clock CLKOUT.

In at least some example embodiments, in a reset operation of the non-retention circuit 140, the second flip-flop 142 receives the reset signal RESETn through the data terminal and is controlled by the output clock CLKOUT, and the reset operation is controlled.

The third flip-flop 144 may receive the reset signal RESETn through the reset terminal, and a reset operation is controlled by the reset signal RESETn regardless of whether the output clock CLKOUT is provided or not. Meanwhile, a data terminal of the third flip-flop 144 may receive data required for the next stage.

Before the non-retention circuit 140 enters the power gating mode, the third flip-flop 144 may be initialized by the reset signal RESETn. Since power is not supplied when it enters the power gating mode, the initialization operation of the third flip-flop 144 is paused. Then, after the power gating mode is released, the initialization operation of the third flip-flop 144 is started again. Further, initialization of the second flip-flop 142 may be started while the output clock CLKOUT is supplied to the non-retention circuit 140. In this case, when the output clock CLKOUT supplied to the non-retention circuit 140 is suspended for a predetermined and/or selected (desired) time, the first flip-flop 132 loads data stored in a separate storage area to restore the previous data of the circuit. Since the data of the first flip-flop 13 is restored after the initialization of the data of the second flip-flop 142 is completed, a normal operation may be assured after the data of the first flip-flop 132 is restored.

Figure 4:
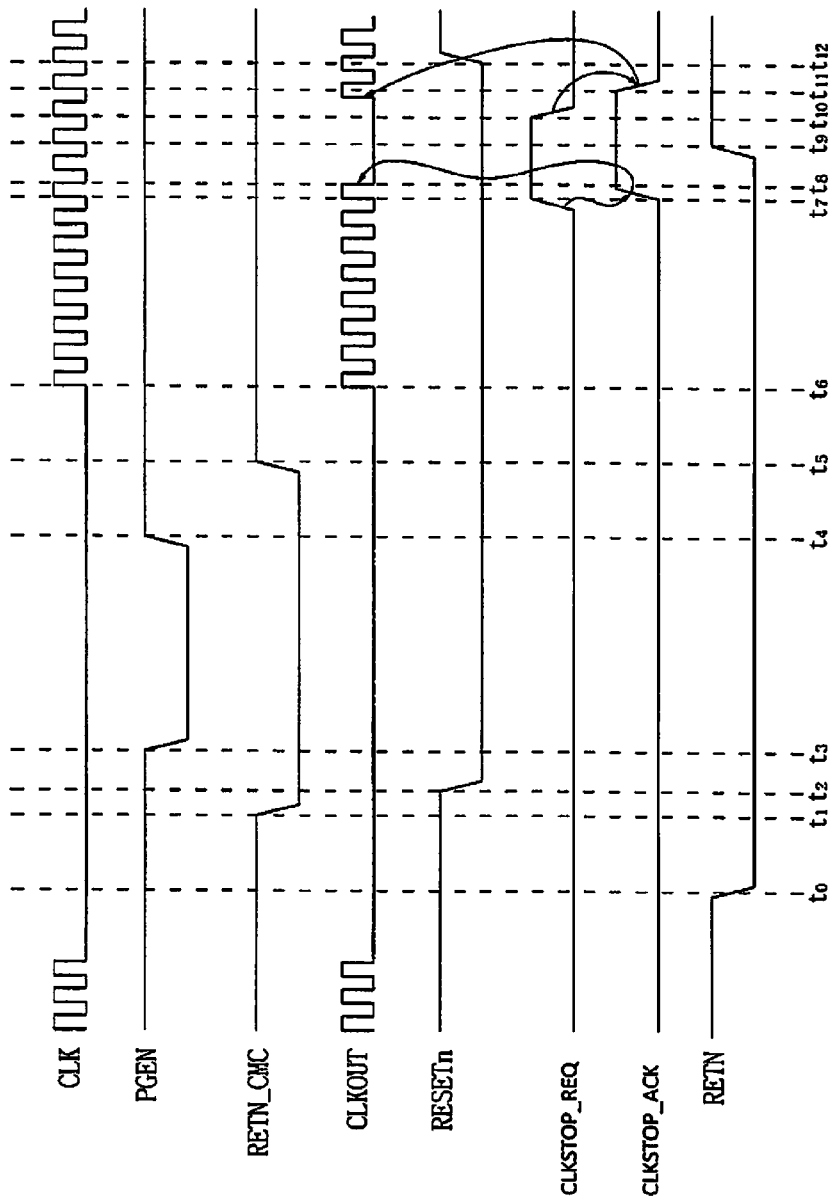
FIG. 4 is a timing diagram showing an operation of the power gating control circuit shown in FIG. 1 according to an example embodiment.

FIG. 4 is a timing diagram showing an operation of the power gating control circuit 100 shown in FIGS. 1 and 3.

When a clock CLK provided from the PMC 110 is toggled, the clock CLK is provided as a fixed level to enter a power gating mode, for example, a low level. That is, clocking of the clock CLK is stopped and a retention signal RETN is activated at a time $t_0$. The retention circuit 130 stores data of flip-flops that requires data retention before the power gating mode is activated.

Thus, the retention circuit 130 stores data that has been latched in the first flip-flop 132 in a separate storage area in response to the retention signal RETN at the time $t_0$.

A CMC retention signal RETN_CMC is activated at a time $t_1$. The CMC 120 enters the retention mode in response to the CMC retention signal RETN_CMC.

The reset signal RESETn activated at a time $t_2$ is provided to the non-retention circuit 140.

The power gating enable signal PGEN is activated at a time $t_3$.

When the power gating enable signal PGEN is activated, it enters the power gating mode, and primary power sources of the CMC 120, the retention circuit 130, the non-retention circuit 140 are blocked and internal operations thereof are paused.

When the power gating enable signal PGEN is deactivated at a time $t_4$, the power gating mode is released, power begins to be supplied to the CMC 120, the retention circuit 130, and the non-retention circuit 140.

Since power is supplied to the non-retention circuit 140 and the reset signal RESETn is activated at the time t4, the third flip-flop 144 is initialized regardless of the clock CLK.

The CMC retention signal RETN_CMC is deactivated at a time $t_5$.

The clock CLK is supplied from a time $t_6$ and the CMC 120 generates the output clock CLKOUT in response to the clock CLK. Meanwhile, data of the second flip-flop 142 is reset in response to the reset signal RESETn and the output clock CLKOUT, which are activated in a state in which power is supplied to the non-retention circuit 140.

When some of outputs of the second flip-flop 142 are provided as input data of the first flip-flop 132, initialization of the second flip-flop 142 is completed before retention of the first flip-flop 132 is restored such that the first flip-flop 132 is not affected by 'an unknown value' before the initialization of the second flip-flop 142.

In a data reset operation of the second flip-flop 142, a clock stop request signal CLKSTOP_REQ is activated at a time $t_7$ and a clock stop acknowledge signal CLKSTOP_ACK is activated at a time $t_8$.

The clock stop request signal CLKSTOP_REQ is activated at the time $t_7$ and is deactivated at a time $t_{10}$. The clock stop acknowledge signal CLKSTOP_ACK is activated at the time $t_8$ and is deactivated at a time $t_{11}$.

Therefore, the output clock CLKOUT may be temporarily suspended during an activation period of the clock stop acknowledge signal CLKSTOP_ACK, that is, during a period from the time $t_8$ to the time $t_{11}$.

The retention signal RETN is deactivated during the period between the time $t_8$ and the time $t_{11}$. In other words, the retention signal RETN is deactivated at the time $t_9$, and thus, a data restoring operation of the first flip-flop 132 of the retention circuit 130 may be controlled to be stably performed.

That is, in at least some example embodiments, when some of outputs of the second flip-flop 142 are provided as input data of the first flip-flop 132, the first flip-flop 132 is not affected by 'an unknown value' before the initialization of the second flip-flop 142.

After the data of the first flip-flop 13 is stably restored, the output clock CLKOUT is provided again to each of the flip-flops, that is, each of the first to third flip-flops 132, 142, and 144.

When the reset signal RESETn is deactivated at a time $t_{12}$, reset operations or initialization operations of the second and third flip-flops 142 and 144 are released.

Figure 5:
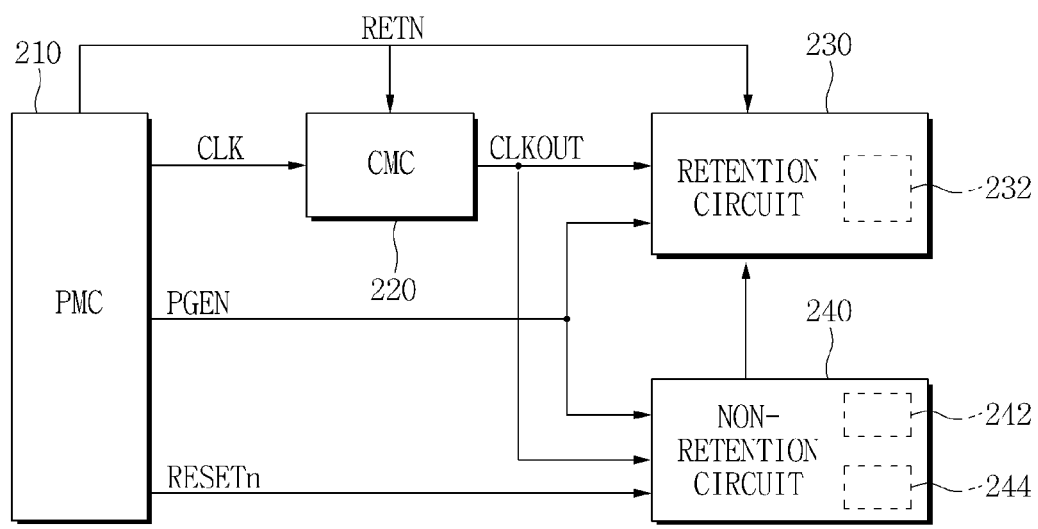
FIG. 5 is a block diagram of a general power gating control circuit according to an example embodiment.

FIG. 5 is an example embodiment of the block diagram of a general power gating control circuit.

Referring to FIG. 5, a power gating control circuit 200 includes at least a power management circuit (PMC) 210, a clock management circuit (CMC) 220, a retention circuit 230, and a non-retention circuit 240.

Compared to FIG. 1, a separate control signal for controlling retention of the CMC 220 is not provided in the general power gating control circuit 200.

Further, the clock stop request signal CLKSTOP_REQ and the clock stop acknowledge signal CLKSTOP_ACK for temporarily suspending of the output clock CLKOUT are also not provided in example embodiment shown in FIG. 5.

The PMC 210 provides power gating control-related signals such as a retention signal (RETN), a clock signal (CLK), a power gating enable signal (PGEN), and a reset signal (RESETn).

The CMC 220 provides the output clock CLKOUT to the retention circuit 230 and the non-retention circuit 240 in response to the clock CLK.

The retention circuit 230, which is a circuit having a retention function, may store or restore an internal status of the retention circuit and some of the register values in response to the retention signal RETN, the output clock CLKOUT, and the power gating enable signal PGEN. The retention circuit 230 includes a flip-flop for retention 232.

The non-retention circuit 240 performs an initialization operation on the internal status of the circuit and the register values in response to the reset signal RESETn, the output clock CLKOUT, and the power gating enable signal PGEN. The non-retention circuit 240 includes a synchronous reset flip-flop 242 and an asynchronous reset flip-flop 244.

Figure 6:
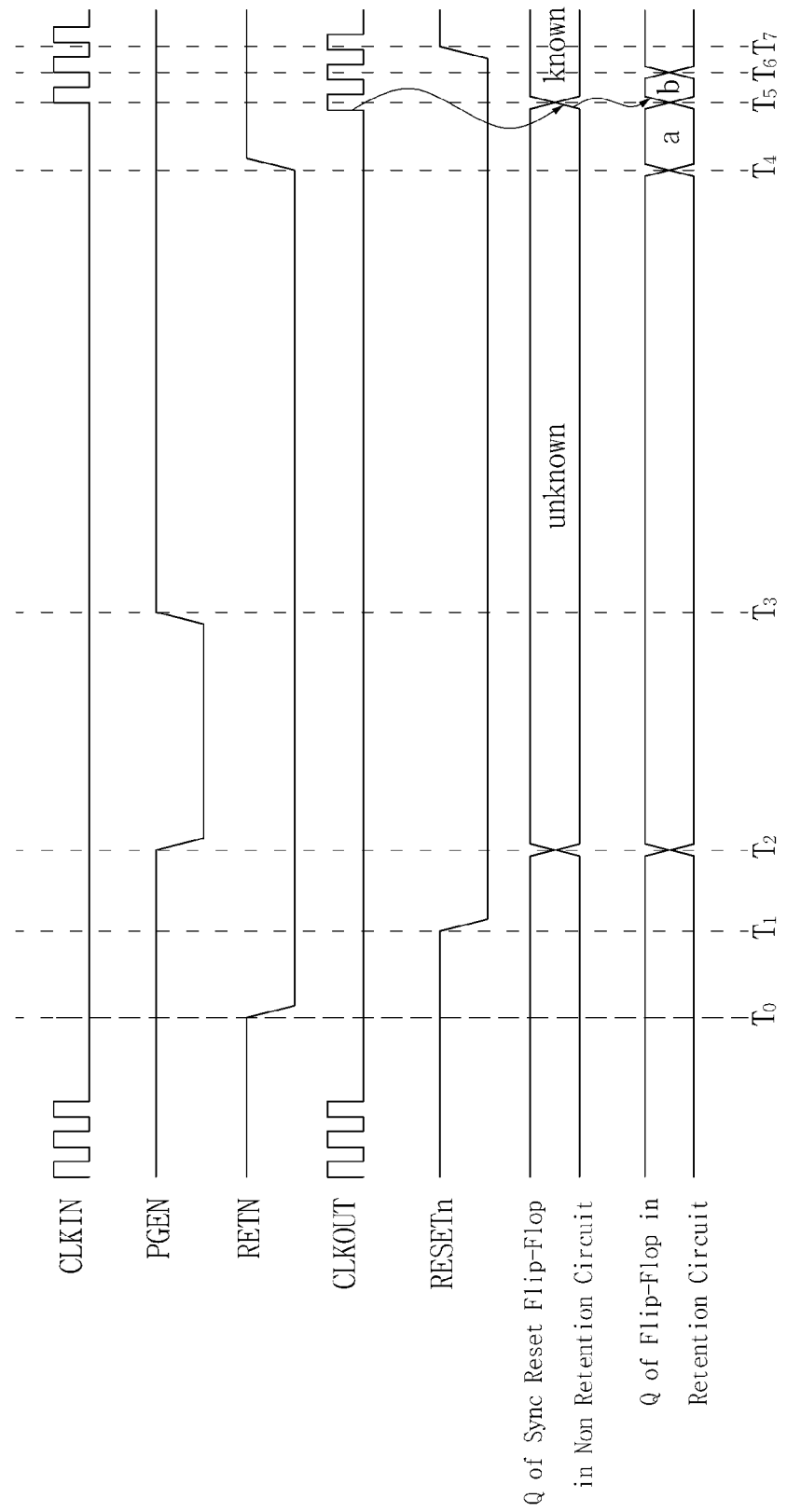
FIG. 6 is a timing diagram showing an operation of the power gating control circuit shown in FIG. 5.

FIG. 6 is an example embodiment of the timing diagram showing an operation of the general power gating control circuit illustrated in FIG. 5.

Referring to FIGS. 5 and 6, before the power gating enable signal PGEN is activated, the retention signal RETN is activated at a time $T_0$. Data of the retention circuit 230 is stored in response to the retention signal RETN.

The reset control signal RESETn activated at the time $T_1$ is provided to the non-retention circuit 240.

The power gating enable signal PGEN is activated and enters the power gating mode at a time $T_2$.

The power gating enable signal PGEN is deactivated and released from the power gating mode at a time $T_3$.

The retention signal RETN is deactivated and the flip-flop for retention 232 of the retention circuit 230 performs a data restoring operation (see a in the drawing) at a time $T_4$.

The output clock CLKOUT is supplied and a reset operation of the synchronous reset flip-flop 242 of the non-retention circuit 240 is started at a time $T_5$. In this case, when there is the flip-flop for retention 232, which receives an output of the synchronous reset flip-flop 242, the content of the data may be updated by receiving the output of the synchronous reset flip-flop 242 during the data restoring operation of the flip-flop for retention 232. When the output clock CLKOUT is changed from a low level to a high level, 'an unknown value' before the synchronous reset flip-flop 242 is reset may be latched at a time $T_5$ due to a characteristic of the synchronous reset flip-flop 242.

That is, after the flip-flop for retention 232 is restored, the data of the flip-flop for retention 232 does not operate as a valid input, and the input data that is not initialized and is invalid is latched, and thus, a malfunction may be generated (see b in the drawing).

Then, the reset control signal RESETn is deactivated and the reset operation of the synchronous reset flip-flop 242 is completed at a time $T_7$.

Figure 7:
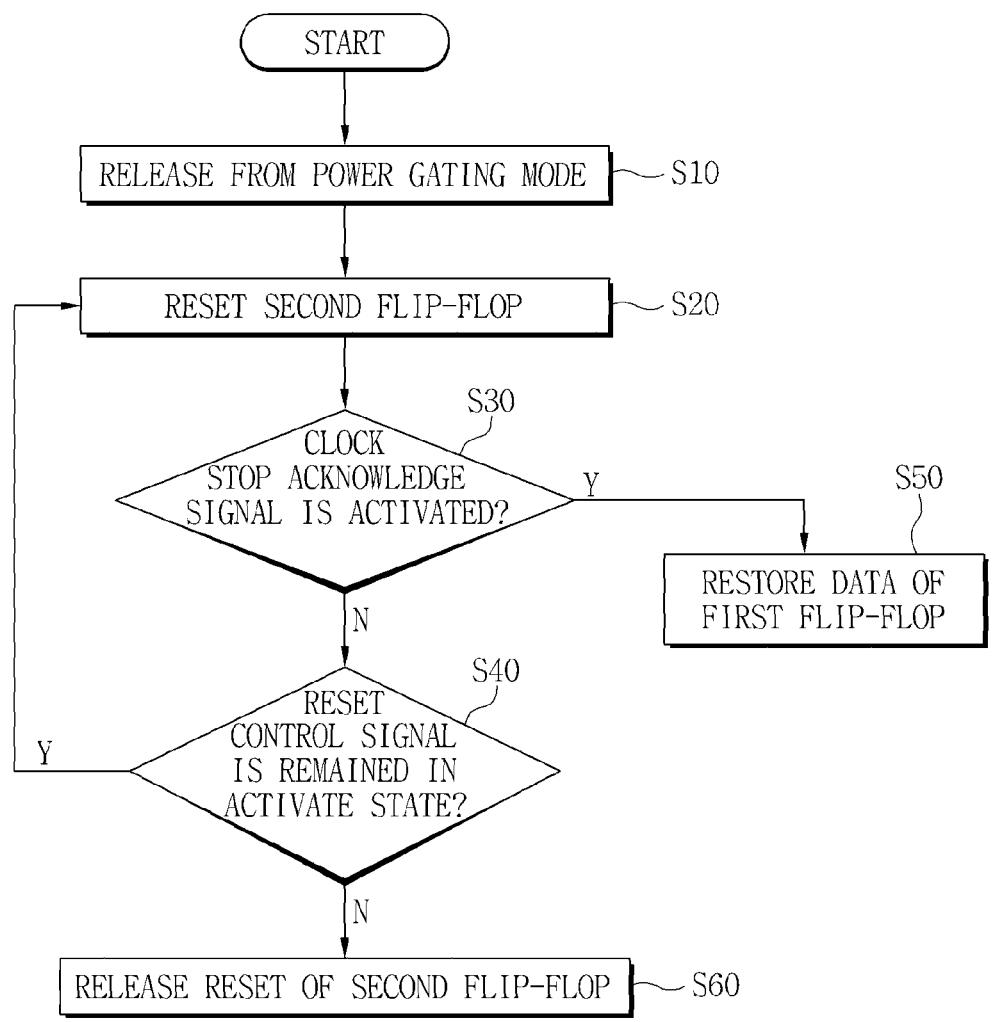
FIG. 7 is a flowchart showing an operation of the power gating control circuit shown in FIG. 1 according to an example embodiment.

FIG. 7 is an example embodiment of the flowchart illustrating an operation of the power gating control circuit illustrated in FIGS. 1 and 3.

For convenience of description, as an example embodiment, operations of the first flip-flop 132 and second flip-flop 142 will be mainly described in a state released from the power gating mode.

Referring to FIG. 7, the power gating mode is released (S10), and the reset operation of the second flip-flop 142 is started (S20).

Referring to FIG. 3, since the output clock CLKOUT is being supplied and the reset control signal RESETn is supplied, the reset operation of the second flip-flop 142 is possible.

Whether the clock stop acknowledge signal CLKSTOP_ACK is activated or not is determined (S30).

When the clock stop acknowledge signal CLKSTOP_ACK is activated (Y), the data of the first flip-flop 132 may be restored. While the clock stop acknowledge signal CLKSTOP_ACK is activated, the output clock CLKOUT is suspended and the retention signal RETN is deactivated, and thus, the data restoring operation of the first flip-flop 132 may be performed.

When the clock stop acknowledge signal CLKSTOP_ACK is deactivated (N), and the reset control signal RESETn remains in an activated state (Y), the second flip-flop 142 may continuously perform the reset operation. That is, in this state, since the output clock CLKOUT is supplied and the reset control signal RESETn is activated, the second flip-flop 142 may perform the reset operation.

Meanwhile, the clock stop acknowledge signal CLKSTOP_ACK is deactivated (N) and the reset control signal RESETn does not remain in an activated state (N), the reset operation of the second flip-flop 142 is released (S60). That is, since the reset control signal RESETn is deactivated, a reset state of the second flip-flop 142 may be released.

In the undescribed third flip-flop 144, the reset control signal RESETn is activated and the reset operation may be surely performed from a time released from the power gating mode.

Figure 8:
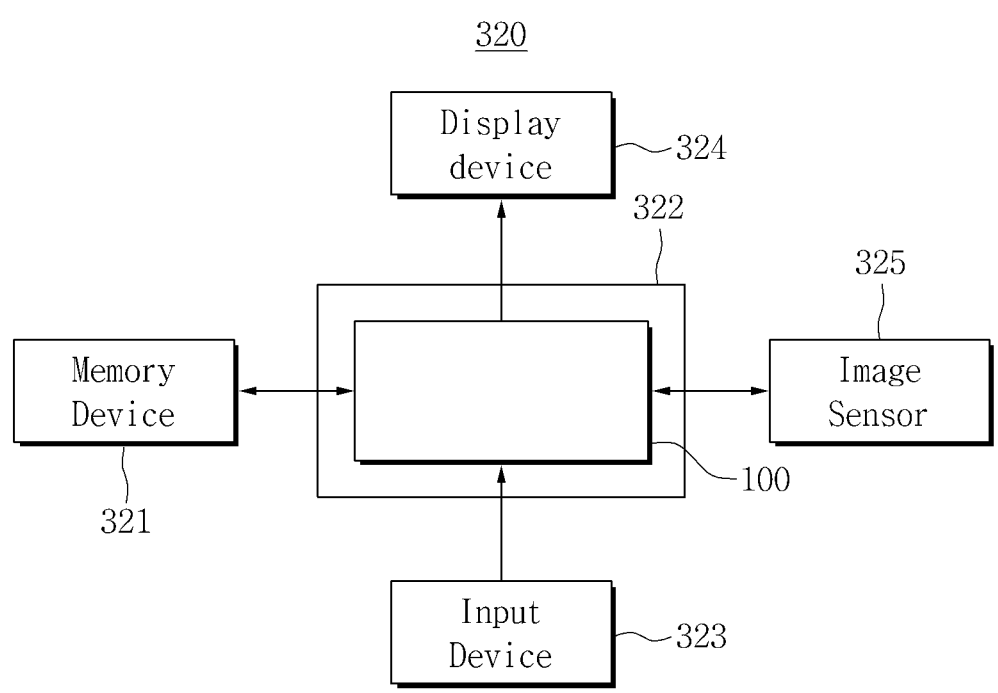
FIG. 8 is a block diagram showing one example embodiment of a mobile device including the power gating control circuit shown in FIG. 1.

FIG. 8 is an example embodiment of the block diagram illustrating a mobile device 320 including the power gating control circuit 100 shown in FIG. 1.

Referring to FIG. 8, the mobile device 320 may be implemented as an image processing device, for example, including but not limited to, a digital camera, a mobile phone in which a digital camera is attached, or a tablet PC.

The mobile device 320 includes a memory device 321, an application processor (AP) 322 including a memory controller, which controls a data processing operation, an input device 323, a display device 324, and an image sensor 325.

The input device 323, which is a device in which a control signal for controlling an operation of the AP 322 or data processed by the AP 322 may be input, may be implemented as a pointing device, such as, including but not limited to, a touch pad or a computer mouse, a keypad, or a keyboard.

The AP 322 may display data stored in the memory device 321 through the display device 324. The AP a control overall operations of the mobile device 320.

The image sensor 325 receives an image through a lens. Therefore, the AP 322 receives the image from the image sensor 325, and processes signals of the received images.

The AP 322 may include a power gating control circuit 100. The power gating control circuit 100 may efficiently control the retention circuit and the non-retention circuit to stably store and restore the data of the retention circuit when a low power mode is used. That is, the power gating control circuit 100 of the AP 322 may control signals so as not to be affected by a reset operation of the non-retention circuit when a retention mode of the retention circuit is released. The power gating control circuit 100 may include the power gating control circuit 100 illustrated in FIG. 1.

Figure 9:
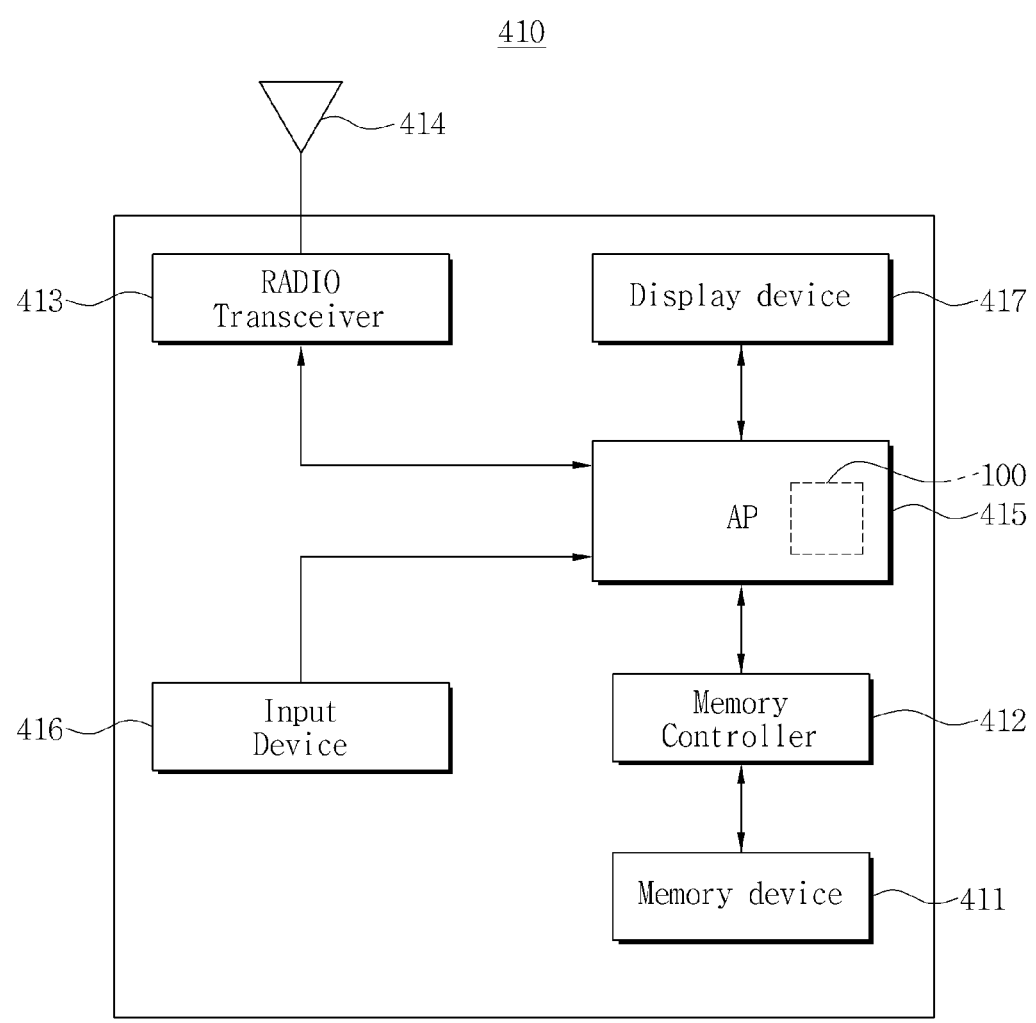
FIG. 9 is a block diagram showing another example embodiment of a mobile device including the power gating control circuit illustrated in FIG. 1.

FIG. 9 is an example embodiment of a block diagram illustrating a computer system 410 including the power gating control circuit shown in FIG. 1.

Referring to FIG. 9, a computer system 410 includes at least a memory device 411, a memory controller 412 that controls the memory device 411, a radio transceiver 413, an antenna 414, an AP 415, an input device 416, and a display device 417.

The radio transceiver 413 may transmit or receive radio signals through the antenna 414. For example, the radio transceiver 413 may convert a radio signal received through the antenna 414 into a signal which may be processed in the AP 415.

Therefore, the AP 415 may process a signal output from the radio transceiver 413 and transmit a processed signal to the display device 417. Further, the radio transceiver 413 may convert a signal output from the AP 415 into a radio signal and output the converted radio signal to an external device through the antenna 414. According to a non-limiting example embodiment of inventive concepts, the AP 415 may include the power gating control circuit 100 illustrated in FIG. 1.

In an example embodiment, the AP 415 may include a power gating control circuit 100. The power gating control circuit 100 may efficiently control the retention circuit and the non-retention circuit to stably store and restore the data of the retention circuit when a low power mode is used. That is, the power gating control circuit 100 of the AP 415 may control signals so as not to be affected by a reset operation of the non-retention circuit when a retention mode of the retention circuit is released. The power gating control circuit 100 may include the power gating control circuit shown in FIG. 1.

The input device 416, which is a device in which a control signal for controlling an operation of the AP 415, or data to be processed by the AP 415 may be input, may be implemented as a pointing device, such as, including but not limited to, a touch pad or a computer mouse, a keypad, or a keyboard.

According to an example embodiment, the memory controller 412, which may control an operation of the memory device 411, may be implemented as a part of the AP 415, or as a chip separated from the AP 415.

The power gating control circuit in accordance with example embodiments of inventive concepts can control to complete initialization of a flip-flop of a non-retention circuit regardless of a type of the flip-flop before a retention mode of a retention circuit is released. Therefore, since both the retention circuit and the non-retention circuit are applied to each function of a circuit and it is possible to separately control the circuit, efficiency of power consumption and area of the circuit can be increased. Furthermore, the power gating control circuit can support a stable restoring operation of data.

Non-limiting example embodiments of inventive concepts can be applied to a power gating control circuit, particularly, a mobile power up circuit and a mobile application processor.

While example embodiments of inventive concepts and their advantages have been described in detail, it should be understood that various changes, substitutions and alterations may be made herein without departing from the scope of general inventive concepts as defined by the following claims.

While inventive concepts have been described with reference to non-limiting example embodiments illustrated in accompanying drawings, these should be considered in a descriptive sense only, and it will be understood by those skilled in the art that various alternations and equivalent other non-limiting embodiments may be made. Therefore, the scope of inventive concepts is defined by the appended claims and their equivalents.

What is claimed is:

1. A power gating control circuit, comprising:
   a retention circuit including a first flip-flop configured to receive an output clock signal, the retention circuit configured to restore data of the first flip-flop after releasing a power gating mode; and
   a non-retention circuit including a second flip-flop and a third flip-flop, the third flip-flop configured to receive the output clock signal, the non-retention circuit configured to,
   initialize data of the second flip-flop after releasing the power gating mode, and
   initialize data of the third flip-flop after releasing the power gating mode,
   wherein the power gating control circuit is configured to initialize the non-retention circuit before the data of the first flip-flop in the retention circuit is restored.

2. The power gating control circuit of claim 1, wherein the first flip-flop of the retention circuit is configured to,
   store the data of the first flip-flop before entering the power gating mode based on the output clock signal and a retention signal,
   restore the data of the first flip-flop after releasing the power gating mode based on the output clock signal and the retention signal, and
   connect to the second flip-flop to receive an output of the second flip-flop.

3. The power gating control circuit of claim 1, wherein the power gating control circuit is configured to,
   initialize the second flip-flop, the second flip-flop including a synchronous flip-flop, an initialization operation of the synchronous flip-flop synchronized with the output clock signal, and
   initialize the third flip-flop, the third flip-flop including an asynchronous flip-flop, an initialization operation of the asynchronous flip-flop being independent of the output clock signal.

4. The power gating control circuit of claim 3, wherein the second flip-flop is configured to initialize the data in the second flip-flop based on the output clock signal, a reset signal, and an inactive power gating enable signal (PGEN).

5. The power gating control circuit of claim 3, wherein the third flip-flop is configured to,
   operate independently of the output clock signal based on a reset signal, and
   initialize the data in the third flip-flop based on the reset signal and an inactive power gating enable signal (PGEN).

6. A power gating control circuit, comprising:
   a power management circuit (PMC) configured to supply power to a plurality of circuits;
   a clock management circuit (CMC) controllable by the PMC, the CMC configured to,
   generate an output clock, and
   operate in a retention mode;
   a retention circuit configured to receive the output clock and operate in the retention mode; and
   a non-retention circuit configured to receive the output clock and initialize data in the non-retention circuit,
   wherein the PMC is configured to enter the CMC into the retention mode and enter the retention circuit into the retention mode independently of each other.

7. The power gating control circuit of claim 6, wherein the PMC is configured to,
   release the retention circuit from the retention mode independently from the initialization of the non-retention circuit.

8. The power gating control circuit of claim 7, wherein the CMC is configured to,
   suspend the output clock based on an inactive power gating enable signal (PGEN).

9. The power gating control circuit of claim 8, wherein the PMC is configured to,
   provide a clock stop request signal to the CMC, the clock stop request signal requesting the output clock to be suspended.

10. The power gating control circuit of claim 6, wherein the PMC is configured to,
provide separate signals to the CMC and the retention circuit, respectively, for entering the retention mode.

11. The power gating control circuit of claim 10, wherein the PMC is configured to,
release the CMC from the retention mode before releasing the retention circuit from the retention mode.

12. The power gating control circuit of claim 6, wherein the retention circuit includes a first flip-flop, and the retention circuit is configured to,
perform one of storing and restoring of data in the retention circuit based on a retention signal and the output clock.

13. The power gating control circuit of claim 9, wherein the non-retention circuit is configured to respond to a reset signal and the output clock, and the non-retention circuit includes,
a first flip-flop synchronized with the output clock, the first flip-flop configured to initialize data in the first flip-flop,
a second flip-flop independent of the output clock, the second flip-flop configured to initialize data in the second flip-flop, and
the first flip-flop is connected to a third flip-flop in the retention circuit such that an output of the first flip-flop is provided to the third flip-flop.

14. The power gating control circuit of claim 13, wherein,
the first flip-flop is a synchronous flip-flop and does not include a reset terminal, and
the second flip-flop is an asynchronous flip-flop and includes the reset terminal.

15. The power gating control circuit of claim 6, wherein the non-retention circuit is configured to,
initialize the data in the non-retention circuit before data of the retention circuit is restored.

16. A power gating control circuit comprising:
a clock management circuit configured to,
generate an output clock signal based on a clock signal,
receive a clock stop request signal from a power management circuit (PMC),
suspend the output clock signal based on the clock stop request signal, and
forward a clock stop acknowledgment signal to the PMC based on the clock stop request signal; and
a retention circuit configured to perform one of storing and restoring of data in the retention circuit based on a retention signal and the output clock signal, the restoring of the data being based on the suspending of the output clock signal.

17. The power gating control circuit of claim 16, further comprising:
a non-retention circuit configured to initialize data in the non-retention circuit based on a reset signal from the PMC, the non-retention circuit configured to initialize the data in the non-retention circuit before the retention circuit restores the data of the retention circuit.

18. The power gating control circuit of claim 17, wherein,
the retention circuit includes a first flip-flop, and
the non-retention circuit includes a second flip-flop and a third flip-flop, the second flip-flop configured to forward output values to the first flip-flop.

19. The power gating control circuit of claim 18, wherein,
the second flip-flop is a synchronous flip-flop and does not include a reset terminal, and
the third flip-flop is an asynchronous flip-flop and includes the reset terminal.

20. The power gating control circuit of claim 18, wherein the third flip-flop is configured to operate independently of the output clock signal.

* * * * *